US010831964B2

(12) United States Patent
Chase et al.

(10) Patent No.: US 10,831,964 B2
(45) Date of Patent: Nov. 10, 2020

(54) IC PHYSICAL DESIGN USING A TILING ENGINE

(71) Applicant: Synopsys, Inc., Mountain View, CA (US)

(72) Inventors: John Ralph Chase, Brentwood, CA (US); Mark William Bales, Livermore, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/852,396

(22) Filed: Sep. 11, 2015

(65) Prior Publication Data

US 2016/0078165 A1 Mar. 17, 2016

Related U.S. Application Data

(60) Provisional application No. 62/049,210, filed on Sep. 11, 2014.

(51) Int. Cl.
*G06F 30/00* (2020.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .................. G06F 17/5072; G06F 17/5081
USPC ........................................................ 716/122
See application file for complete search history.

(56) References Cited

U.S. PATENT DOCUMENTS

| | | | | |
|---|---|---|---|---|
| 5,838,583 A * | 11/1998 | Varadarajan | ........ | G06F 17/5072 716/123 |
| 7,089,526 B1 * | 8/2006 | Salowe | ................. | G06F 30/394 716/129 |
| 7,096,445 B1 * | 8/2006 | Pucci | .................. | G06F 17/5068 716/119 |
| 7,222,322 B1 * | 5/2007 | Chyan | ................. | G06F 17/5077 716/122 |
| 8,601,419 B1 * | 12/2013 | Chiang | ............... | G06F 17/5081 716/112 |
| 8,839,177 B1 * | 9/2014 | Aubel | ................. | G06F 17/5072 716/132 |
| 2009/0158299 A1 * | 6/2009 | Carter | .................. | G06F 9/4843 719/319 |
| 2009/0271749 A1 * | 10/2009 | Tang | .................... | G06F 17/5081 716/106 |
| 2010/0199247 A1 * | 8/2010 | Huynh | ................ | G06F 17/5063 716/119 |
| 2014/0044135 A1 * | 2/2014 | Sankaralingam | ..... | H04L 45/745 370/401 |
| 2017/0262570 A1 * | 9/2017 | Sakajiri | ............... | G06F 17/5081 |

* cited by examiner

*Primary Examiner* — Suchin Parihar
(74) *Attorney, Agent, or Firm* — Alston & Bird LLP (57) ABSTRACT

In general, embodiments of the present invention provide systems, methods and computer readable media for generating a tiling for a physical placement of a plurality of circuits. The method includes generating a tiling including a plurality of tiles, where each tile identifies a tile geometric area, and a list of one or more of the circuits to be placed in the tile geometric area. The tiling is based on a description of one or more user constraints, where each user constraint identifies a constraint geometric area, and a characteristic of circuits to be placed in the constraint geometric area.

24 Claims, 6 Drawing Sheets

IC PHYSICAL DESIGN USING A TILING ENGINE

CROSS-REFERENCE TO RELATED APPLICATIONS

The present application claims the benefit of U.S. Provisional Application No. 62/049,210, entitled "DYNAMICALLY OPTIMIZING A DATA SET DISTRIBUTION," and filed Sep. 11, 2014, the content of which is incorporated herein by reference in its entirety.

FIELD

Embodiments of the invention relate, generally, to physical design for an integrated circuit (IC), and more particularly to systems and methods of generating a tiling for the physical layout of an IC.

BACKGROUND

In electronic design automation (EDA), placement problems consist of assigning locations to objects ("cells") on a chip surface. Placement of a circuit is generally understood to refer to the positioning of circuit elements, such as circuit cells, on a common substrate. The cells are subject to constraints specified by the user, which limit the placement of cells to certain geometric regions on the chip. For example, a constraint may dictate that a particular type of cell must be placed within a particular geometric region, and all remaining cells must be excluded from the region.

Placement problems involve many user constraints, and any particular cell may be subject to multiple constraints. The constraint regions may be complex and non-contiguous, and the regions between different constraints may overlap. Further, any particular constraint may be subject to a policy choice in regards to definition or enforcement.

This presents a challenge to placement engines—not only must a complex association of user constraints be honored, but there may not be a single correct interpretation of the constraints. Therefore, inconsistent results across multiple placement engines in a given application are experienced. Consistent, efficient, and reliable placement results from a simple, abstract, and well-defined problem to be solved.

Once placement is finished, it can be expensive to report how constraints influenced the final result. If placement fails, it can be difficult to diagnose the cause if constraints contradict in a complex way.

SUMMARY

One inventive aspect is a method of generating a tiling for a physical placement of a plurality of circuits. The method includes generating a tiling including a plurality of tiles, where each tile identifies a tile geometric area, and a list of one or more of the circuits to be placed in the tile geometric area. The tiling is based on a description of one or more user constraints, where each user constraint identifies a constraint geometric area, and a characteristic of circuits to be placed in the constraint geometric area.

In some embodiments a tiling engine transforms or abstracts a large set of ambiguously defined user constraints with complex interactions into a simple, unambiguous placement problem: a partition/"tessellation"/"tiling" of the placement area into geometric regions ("tiles"), each of which has a list of cells that must be placed therein. In some embodiments, the tiles do not overlap each other, and together cover the entire placement area.

The systems and techniques described here may provide one or more of the following advantages.

This approach presents a consistent and straightforward representation of the placement problem to the placement engines in an application, with the ambiguity and complexity of the original user constraints abstracted away. The policy choices involved in interpreting the user constraints are removed from the placement engine and localized to the tiling engine. Because the tiling engine controls constraints and constraint enforcement, different placement engines within the tool always receive the same tiling. Accordingly, IC placements are generated based on consistent interpretations of the user constraints.

Further, information regarding the user constraints for each tile is stored so that each tile of the tiling can be queried as to the particular user constraints which resulted in the tile's region and cells. If partitioning fails, a list of "infeasible" tiles, which have zero-area regions but contain cells that must impossibly be placed within, may be generated. The infeasible tiles can, just as with other tiles, be queried regarding user constraints to provide the reason for the infeasibility.

In some embodiments, the tiling engine is customer-facing and defines the types of user constraints available. The tiling engine also uses constraints according to an enforcement policy. Before this invention, placement engines would query the data model for various types of user constraints, and apply those constraints during placement as each engine understands them. If the definition or enforcement policy of a particular user constraint type were to change, each placement engine would have to change their interpretation of the constraints. Examples of user constraints include: exclusive move bounds, voltage areas, and hierarchical boundaries.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

For the purposes of explanation, the ensuing details are set forth in order to provide a thorough understanding of various embodiments. It will be apparent, however, to one skilled in the art that various embodiments may be practiced without some of these specific details. For example, circuits, systems, networks, processes, and other components may be shown as components in block diagram form in order not to obscure the embodiments in unnecessary detail. In other instances, known circuits, processes, algorithms, structures, and techniques may be shown without unnecessary detail in order to avoid obscuring the embodiments. In other instances, well-known structures and devices are shown in block diagram form.

Embodiments provided herein are examples only, and are will not intended to limit the scope, applicability, or configuration of the disclosure. Rather, the ensuing description of the embodiments will provide those skilled in the art with an enabling description for implementing one or more embodiments. It should be understood that various changes may be made in the function and arrangement of elements without departing from the spirit and scope of the disclosed systems and methods as set forth in the appended claims.

Also, individual embodiments may, for example, be described as one or more processes which are depicted as flowcharts, flow diagrams, data flow diagrams, structured diagrams, or block diagrams. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Figure 1:
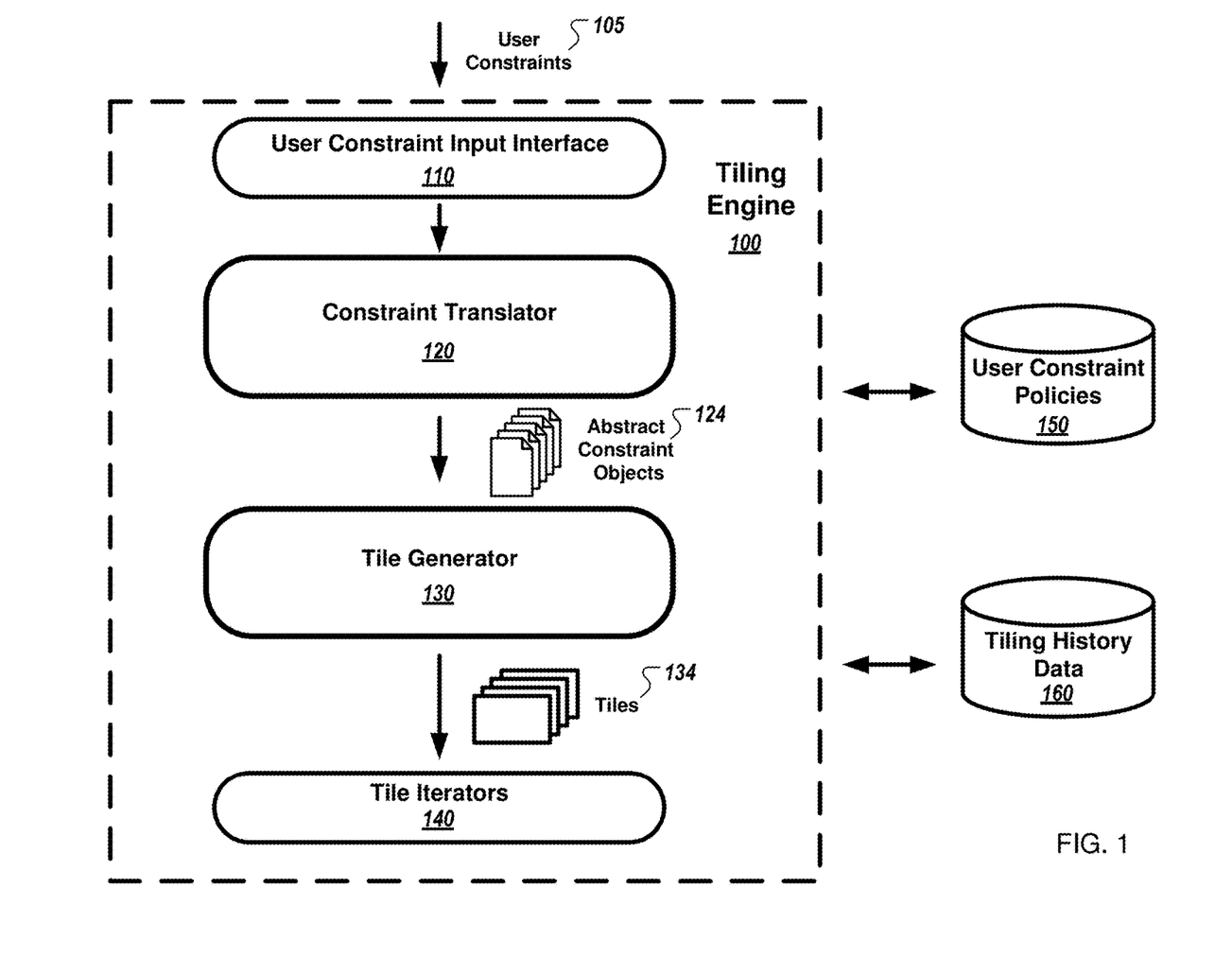
FIG. 1 illustrates an example system that can be configured to implement a tiling engine in accordance with some embodiments of the present invention.

FIG. 1 illustrates an exemplary tiling engine 100 of a computer system, in accordance with one embodiment of the present invention. In one embodiment, a tiling engine includes a user constraint input interface 110 configured to be customer-facing and to receive input user constraints 105 describing a particular placement area; a constraint translator 120 configured to generate a set of abstract constraint objects 124 using a set of input user constraints and associated user constraint policies retrieved from a group of stored user constraint policies 150; and a tile generator 130 configured to create a binary tree using a set of input user constraints to generate a set of tiles 134 representing a tessellation of the placement area into geometric regions. In some embodiments, tiling engine 100 may provide at least one user-configurable tile iterator 140 to enable users to examine and query the set of tiles 134. In some embodiments, tiling engine 100 may collect and store tiling history data 160 during constraint translation and tile generation; customers may access this data to understand/debug the results of applying the constraints.

Figure 2:
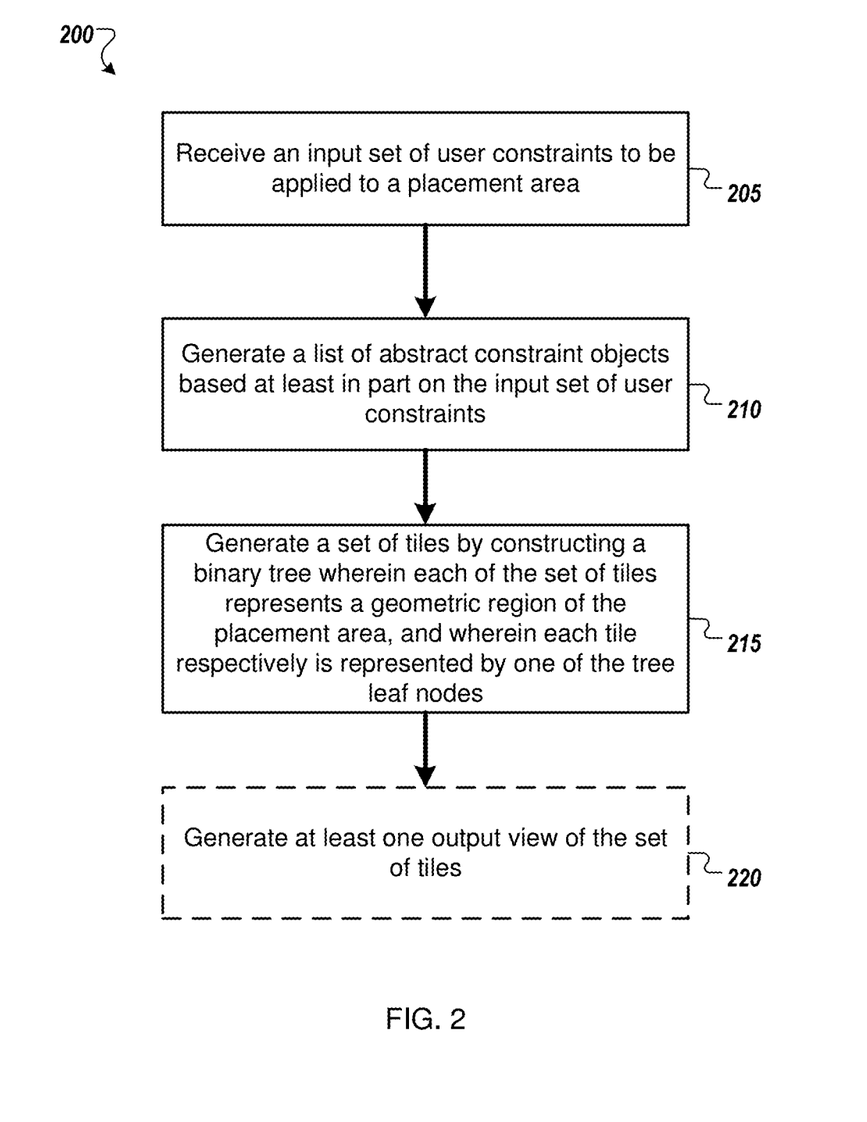
FIG. 2 is a flow diagram of an example method for tiling of a placement area into geometric regions ("tiles"), each of which has a list of cells that must be placed therein in accordance with some embodiments of the present invention.

FIG. 2 is a flow diagram of an example method 200 for tiling of a placement area into geometric regions ("tiles"), each of which has a list of cells that must be placed therein. For convenience, the method 200 will be described with respect to a system that includes one or more computing devices and performs the method 200. Specifically, the method 200 will be described with respect to processing of a set of input user constraints 105 associated with a particular placement area by tiling engine 100.

In embodiments, the system receives 205 an input set of user constraints to be applied to a placement area. In some embodiments, the input set of user constraints may further include tiling processing customization data describing, for example, ordering and/or prioritization of cell placement (e.g., "Cell A must be placed in this particular region due to its special characteristics"; "Cells A, B, and C must be placed together in this particular region"; "Cells C, D, E, F, G are supplied by voltage area V0"; "Cells F and G are in a particular macro"; "Cell G must be placed on the right side of the macro for timing purposes").

In various embodiments, an input set of user constraints may include one or a combination of the following types of constraints:

Hierarchical boundaries. A hierarchical boundary constraint constrains placement of a particular entity in a hierarchical design. As a result of the hierarchical boundary constraint, all the leaf cells of the particular entity are placed into a particular geometric region, and any cells not within the hierarchy are excluded from the particular geometric region.

Voltage Area. A voltage area constraint constrains placement of cells of a particular voltage or power domain. As a result of the voltage area constraint, all cells of the particular voltage or power domain are placed within a geometric region (voltage area) on the chip in which the particular voltage or power domain is in effect. All other cells are excluded from the voltage area.

Voltage Area Regions. In some embodiments, voltage areas include cells which are subject to an additional constraint. A voltage area region constraint constrains placement of cells of a particular category or type which are in a particular voltage area. As a result of the voltage area region constraint, all cells of the particular category or type are placed within a geometric region of the particular voltage area on the chip. All other cells are excluded from the geometric region.

Exclusive move bounds. An exclusive move bounds constraint constrains placement of a particular set of cells within a geometric region, and exclude all other cells from the geometric region.

Site Rows. A site row constraint constrains placement of cells having a common geometric characteristic within a geometric region. All other cells are excluded from the geometric region.

IO Guide. An IO guide constraint constrains placement of IO cells to a geometric region dedicated for IO cells.

In some embodiments, the system generates 210 a list of abstract constraint objects 124 based at least in part on the input set of user constraints 105. During this abstraction phase, the input user constraints are abstracted into a set of constraint objects. The generation of a list of abstract constraint objects (also referred to herein as constraint objects) is described in detail with reference to method 300 and FIG. 3.

In some embodiments, the system generates 215 a set of tiles 134 by constructing a binary tree, wherein each of the set of tiles represents a geometric region of the placement area, and wherein each tile respectively is represented by one of the tree leaf nodes. Generating a set of tiles will be described in detail with reference to FIGS. 4-5.

In some embodiments, the system generates 220 at least one output view of the generated set of tiles 134. In some embodiments, for example, the system may provide at least one user-configurable iterator associated with the set of tiles 134.

Figure 3:
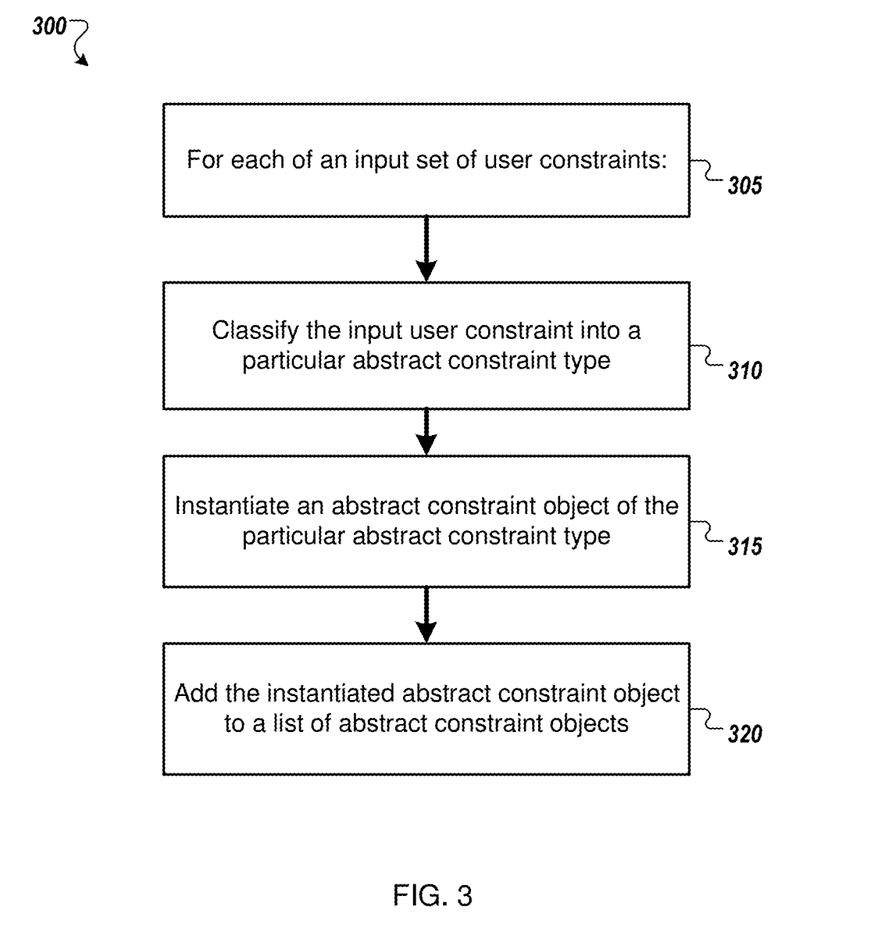
FIG. 3 is a flow diagram of an example method for generating a list of abstract constraint objects using a set of input user constraints in accordance with some embodiments of the present invention.

FIG. 3 is a flow diagram of an example method 300 for generating a list of abstract constraint objects using a set of input user constraints. For convenience, the method 300 will be described with respect to a system that includes one or more computing devices and performs the method 300. Specifically, the method 300 will be described with respect to processing of step 210 in method 200.

In embodiments, each input user constraint 305 is classified 310 into one of a pre-determined set of abstract constraint types prior to instantiation of its associated constraint object, and the calculation of the properties of the constraint object when the abstract constraint object is instantiated 315 may include user constraint definitions and policy. In some embodiments, the user constraint definitions and policy may be retrieved from a group of stored user constraint policies 150.

In some embodiments, each instantiated abstract constraint object has the following properties:

Name—a descriptive name of the constraint, suitable, for example, for use in user messages.

Region—the geometric region within the placement area over which the constraint applies. In some embodiments, the region is not contiguous.

Object list—the list of cells which are to be placed within the region. Note that a given cell may appear in the object list of multiple constraints.

The calculation of these properties is where the details of the definition and enforcement policy of the various user constraints are applied.

In embodiments, an object list also can represent a level of abstraction: not only is it based on its respective constraints, but it includes the entire set of "leaf" cells under the hierarchy being constrained—that is, some of the cells in the user constraint may be "hierarchical," i.e., they reference lower levels of hierarchy that themselves contain cells and constraints. In this case, the hierarchy can be expanded during object list construction, and the lowest-level cells ("leaf cells") that are to be considered atomic with respect to placement are gathered together. This spares a placement engine from also having to perform this user data-specific task. However, in some embodiments, the placement engine may be given options to control the expansion of hierarchies.

Following are descriptions of exemplary types of geometric abstract constraints:

Hierarchical boundaries. If the policy is to define and enforce the geometric area of a hierarchical object by combining the geometries of all objects contained within the hierarchical object, then the combination, i.e. "flattening", of all the contained geometries is an abstraction that will be used by the tiling engine for the tiling output. The tiling engine performs the calculations, such that the placement engine need not do any hierarchy-specific calculations.

Voltage areas. In some cases, voltage area user constraints define multiple voltage areas which overlap. This creates a potential contradiction. In such situations, a stacking order method may be used by the tiling engine to determine the "effective" area to which each voltage area constraint applies. The tiling engine uses the stacking order of the multiple voltage areas to generate the tiling. As a result the placement engine need not know or care about the geometric details of voltage area user constraints. Further, the user may specify a "guard band" for voltage areas, which may also be accounted for by the tiling engine in generating the tiling.

Exclusive move bounds. When an exclusive move bounds user constraint specifies a set of cells and a corresponding geometric area, the constraint may include the specified cells within the geometric area, and exclude all others, or to exclude the specified cells from within the geometric area, and include all others. The tiling engine abstracts the user exclusive move bounds constraint into a purely inclusive representation, which the tiling engine uses in the computation of the final tiling.

Site rows. A site row user constraint specifies indirect information such as origin, orientation, site count, and margin (perimeter spacing). The tiling engine abstracts this information into a specific geometric area associated with the site row user constraint.

IO guides. A IO guide user constraint specifies indirect information such as a line against which the IO cells must be placed and a margin. The tiling engine abstracts this information into a specific geometric area associated with IO guide user constraint.

Coordinates (applies to all constraint types): The user constraint specifies geometric coordinates relative to the hierarchy in which the cells associated with the constraint reside. The tiling engine translates this information to global coordinates during the abstraction process.

Following are descriptions of exemplary types of object list abstractions:

Hierarchical cells (all constraints). The user constraint may specify a hierarchical cell to which the constraint applies. However, the hierarchy that cell references may contain many other cells in lower hierarchies. The tiling engine flattens that hierarchy into a single object list of placeable leaf cells, which is then used in generating the tiling.

Voltage areas. The user constraint defines cells associated with a voltage area, and potentially a number of power domains associated with the voltage area. The tiling engine may exclude cells from the voltage area if they do not belong to one of the power domains, or if they implicitly belong to another voltage area through mutual power domain membership across voltage areas.

Site rows. The user constraint defines cells having a particular geometric characteristic as being available for placement within a particular site row. The object list for this constraint is calculated by the tiling engine and used for the tiling.

Following are descriptions of exemplary types of policies:

There are different ways a hierarchical boundary user constraint can be defined or enforced. For example, a hierarchical boundary user constraint can be indirectly defined as including the bounding box which encloses all constrained hierarchical objects within the hierarchy. Alternatively, a hierarchical boundary user constraint can be defined as including a geometric region which the user explicitly specifies. It may, for example, be policy to enforce one or the other option, or to only enforce the hierarchical constraint if the geometry was explicitly set. The tiling engine will use the policy to be enforced during the generation of the tiling. As a result, the placement engine may not be informed of the policy nor updated if the policy changes.

Voltage areas have policies regarding cell membership in relation to power domains, as described to above. Also, there may be policies in place to have a "default" voltage area to cover areas which aren't covered by explicit user-specified voltage areas. The geometry and membership of such default voltage areas are an issue of policy. The tiling engine generates the tiling based on the policies to be enforced. As a result, the placement engine may not determine placement based on policy enforcement, but may rather determine placement based on the tiling, which was generated by the tiling engine so as to enforce policy.

Existence. New constraint types may be introduced, or existing constraint types may be deprecated. These developments may be incorporated into the tiling engine, and the placement engine may not be modified.

In some embodiments, the system generates a list of abstract constraints 320 by traversing the design hierarchy at and below the top level to which tiling is being applied. The first constraint is referred to as the "universe" constraint, as it represents the hierarchical boundary of the top level. The universe constraint's region will be the entire placement area of the tiling, and its object list will be the entire set of placeable leaf cells that will appear in the tiling.

With the universe constraint at the top of the list, subsequent ordering of constraints will not affect tiling correctness, though ordering can impact the efficiency of the computation, as well as the meaningfulness of resulting tiles' "genealogy." In some embodiments, the ordering of the list of abstract constraints may be based on one or more heuristics.

Figure 4:
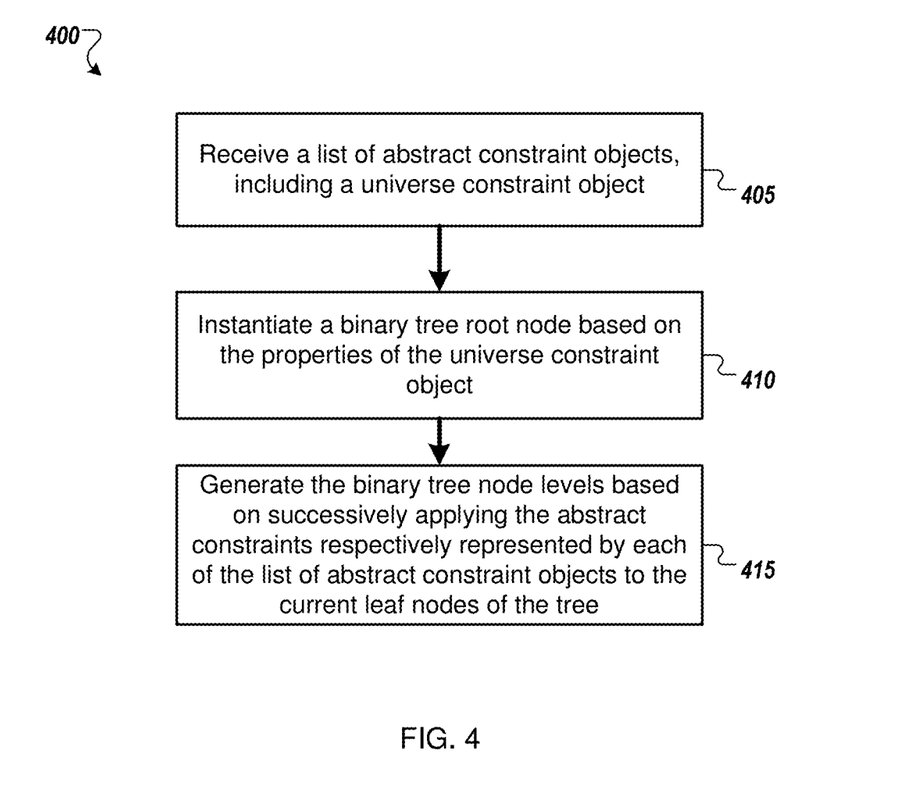
FIG. 4 is a flow diagram of an example method for generating a set of tiles by constructing a binary tree and applying a set of abstract constraints in accordance with some embodiments of the present invention.

FIG. 4 is a flow diagram of an example method 400 for generating a set of tiles by constructing a binary tree and applying a set of abstract constraints. For convenience, the method 400 will be described with respect to a system that includes one or more computing devices and performs the method 400. Specifically, the method 400 will be described with respect to processing of step 215 in method 200.

In embodiments, the system receives 405 the list of abstract constraint objects, and computes the tiling by starting with the universe constraint's region and object list 410, and then partitioning the region and object list based on subsequent constraints 415. For example, we start with a single tile based on the universe constraint ("U")—its region and object list are that of U. We now split this tile into two tiles based on the next constraint "A": a tile whose region and object list is the intersection of those of A with those of U's tile, and a tile whose region and object list is the intersection of those of the complement of A with those of U. Each successive constraint in the constraints list partitions the previous tiles into two respective tiles: the intersection of the tile with the constraint's region and object list, and the intersection with the complement of the constraint's region and object list.

By this process we construct a binary tree (the "constraint tree"), with each level of the tree corresponding to a constraint in the constraint list, such that the tiles in a given level are the partitioning of the tiles in the previous level based on that level's constraint.

Figure 5:
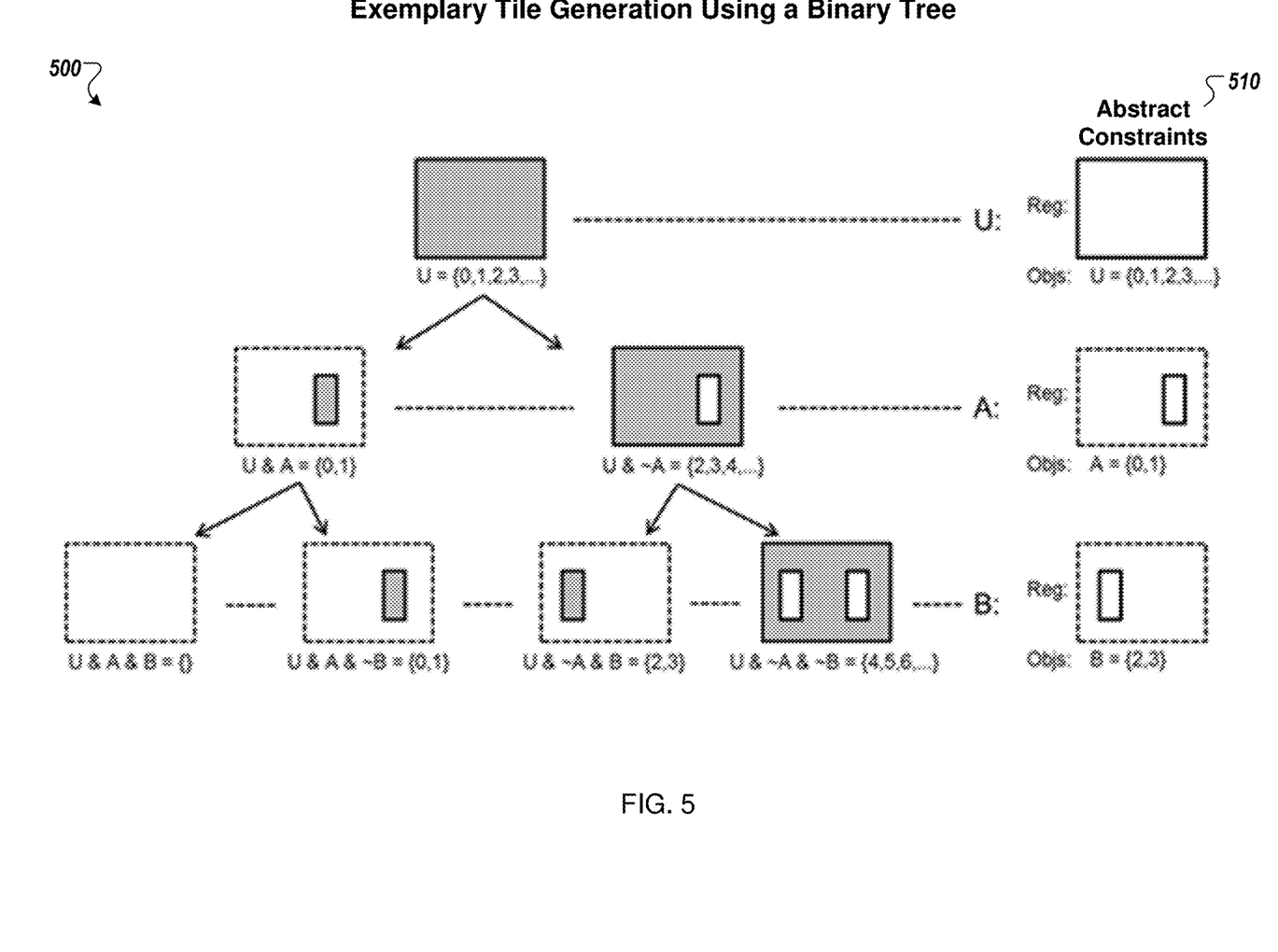
FIG. 5 illustrates an exemplary tile generation using a binary tree in accordance with some embodiments of the present invention.

FIG. 5 illustrates an exemplary tile generation 500 using a binary tree, according to various embodiments of the invention. The list of abstract constraints 510 includes a universe constraint "U" and two other constraints, "A" and "B". The example is presented for illustration, and not for limitation.

The leaf tiles of the tree with non-empty regions and/or non-empty object lists are the tiles that are returned as output 134 from the tiling engine 100. Their regions and object lists are the result of the logical partitioning that took place during the building of the constraint tree. If the tiling results in any tiles with an empty (zero-area) region but a non-empty object list, then the tiling is considered infeasible because there exists cells which cannot be legally placed.

Any tiles that have empty object lists do not need to be partitioned in the course of building the constraint tree, so the tree may be "pruned" by removing such tiles, which will limit the total size of the constraint tree.

Each tile of the tiling is a leaf at the bottom of the constraint tree, which is a product of the intersection of the constraint or constraint complement over the entire constraint list. We refer to the logical statement of this construction as the tile's "genealogy". A genealogy, which can be created by walking up the tree and recording whether that node represents that level's constraint or constraint complement. Referring to the example 500, the genealogy of the second tile from the right would be "U &~A & B". A more compact but equally clear genealogy statement would be "B", as the universe and constraint complements are implicit.

Figure 6:
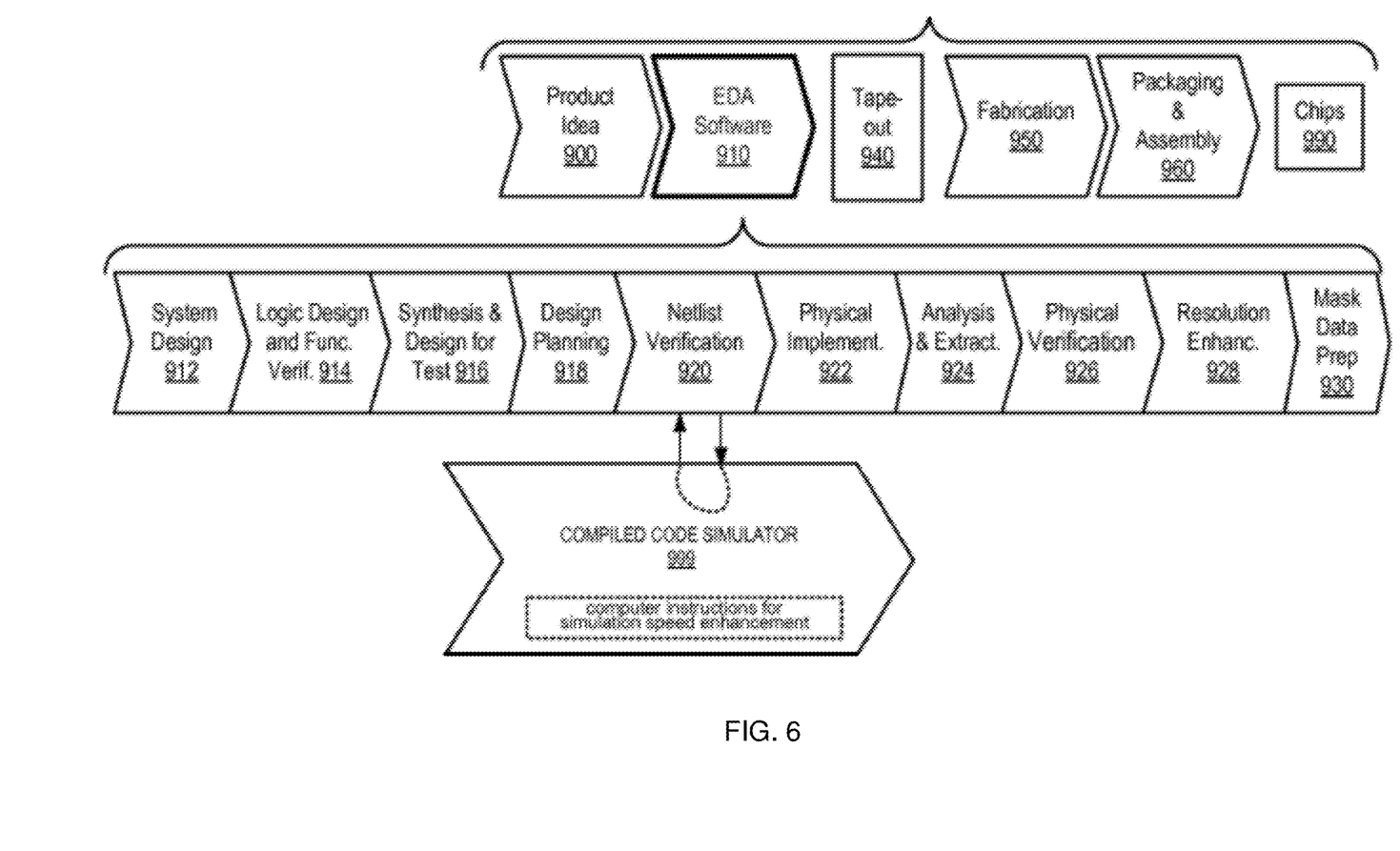
FIG. 6 illustrates an exemplary digital ASIC design flow, in accordance with some embodiments of the present invention.

FIG. 6 illustrates an exemplary digital ASIC design flow. At a high level, the process of designing a chip starts with the product idea (900) and is realized in an EDA software design process (910). When the design is finalized, it can be taped-out (event 940). After tape out, fabrication process (950) and packaging and assembly processes (960) occur resulting, ultimately, in finished chips (result 990). The steps described herein may, for example, be applicable to at least stages 922, 924, and 926, described below.

The EDA software design process (910) includes a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys®, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys®, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys®, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys®, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys®, Inc. that can be used at this stage include VCS, VERA, Formality and PrimeTime products.

Note that a compiled code simulator 999 can be used during this stage 920. If the displayed results are not satisfactory, a chip designer may go back to stage 916 to make changes to the IC design.

Physical implementation (stage 922): The placement (positioning of circuit elements, such as the above-described sequential cells and combinational cells) and routing (connection of the same) occurs at this step. Exemplary EDA software products from Synopsys®, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry in the real world is created after this stage as described below.

Analysis and extraction (stage 924): At this step, the circuit function is verified at a transistor level, this in turn permits what-if refinement. Exemplary EDA software products from Synopsys®, Inc. that can be used include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys®, Inc. that can be used at this stage include the Hercules product.

Resolution enhancement (stage 928): This involves geometric manipulations of the layout to improve manufacturability of the design. Exemplary EDA software products from Synopsys®, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys®, Inc. that can be used include the CATS® family of products. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods described herein. Another embodiment uses a carrier wave that includes instructions to perform a method as described herein.

A computer system used in some embodiments to implement a simulation speed enhancer of the type described herein uses one or more Linux® operating system workstations (based on IBM®-compatible PCs) and/or Unix® operating systems workstations (e.g. SUN Ultrasparc, HP PA-RISC, or equivalent), each containing a 2 GHz CPU and 1 GB memory, that are interconnected via a local area network (Ethernet).

As described above in this disclosure, aspects of embodiments of the present invention may be configured as methods, mobile devices, backend network devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices.

Embodiments of the present invention have been described above with reference to block diagrams and flowchart illustrations of methods, apparatuses, systems and computer program products. It will be understood that each block of the circuit diagrams and process flow diagrams, and combinations of blocks in the circuit diagrams and process flowcharts, respectively, can be implemented by various means including computer program instructions. These computer program instructions may be loaded onto a general purpose computer, special purpose computer, or other programmable data processing apparatus, to produce a machine, such that the computer program product includes the instructions which execute on the computer or other programmable data processing apparatus create a means for implementing the functions specified in the flowchart block or blocks.

These computer program instructions may also be stored in a computer-readable storage device that can direct a computer or other programmable data processing apparatus to function in a particular manner, such that the instructions stored in the computer-readable storage device produce an article of manufacture including computer-readable instructions for implementing the function described herein. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions described herein.

Accordingly, blocks of the block diagrams and flowchart illustrations support combinations of means for performing the specified functions, combinations of steps for performing the specified functions and program instruction means for performing the specified functions. It will also be understood that each block of the circuit diagrams and process flowcharts, and combinations of blocks in the circuit diagrams and process flowcharts, can be implemented by special purpose hardware-based computer systems that perform the specified functions or steps, or combinations of special purpose hardware and computer instructions Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A computer system comprising a tiling engine configured to transform a circuit netlist and a set of user constraints to a physical layout representative of the circuit, the tiling engine comprising:
 a user constraint input interface configured to receive the set of user constraints;
 a constraint translator configured to:
  generate a list of abstract constraint objects in accordance with the set of user constraints and a set of rules stored in a database by:
   for each user constraint of the input set of user constraints:
    classifying the input user constraint into an abstract constraint type selected from a pre-defined set of abstract constraint types;
     instantiating an abstract constraint object of the particular abstract constraint type based at least in part on the input user constraint and an enforcement policy associated with the input user constraint; and
     adding the instantiated abstract constraint object to the list of abstract constraint objects, each constraint object defining a physical region and a list of circuit cells to be included in the physical region; and
 a tile generator configured to:
  generate a constraint tree comprising a plurality of levels each associated with a different one of the abstract constraint objects;
  generating a set of tiles using the list of abstract constraint objects, wherein each tile within the set of tiles respectively describes a geometric region of the placement area, and wherein generating the set of tiles comprises constructing a binary tree in which the root node represents the universe constraint, each tree node level represents a result of applying one of the list of abstract constraint objects, and each of the set of tiles is respectively represented by one of the tree leaf nodes; and
  defining at least one region in which a circuit cell is to be placed based on the set of tiles.

2. The computer system of claim 1 wherein said tile generator is further configured to generate the at least one region in which a cell is to be placed by determining an intersection between the level's associated constraint object and at least a second region defined by a constraint object of the level's preceding level.

3. The computer system of claim 2 wherein said tile generator is further configured to generate the at least one region in which a cell is to be placed by determining an intersection between the level's associated constraint object and a complement of at least a second region defined by a constraint object of the level's preceding level.

4. A computer-implemented method of generating a physical layout of a circuit from a netlist of the circuit, the computer-implemented method comprising:
 receiving, using the computer, a set of user constraints;
 generating a list of abstract constraint objects, using the computer, in accordance with the set of user constraints and a set of rules stored in a database by:
  for each user constraint of the input set of user constraints:
   classifying the input user constraint into an abstract constraint type selected from a pre-defined set of abstract constraint types;
   instantiating an abstract constraint object of the particular abstract constraint type based at least in part on the input user constraint and an enforcement policy associated with the input user constraint; and
   adding the instantiated abstract constraint object to the list of abstract constraint objects, each constraint object defining a physical region and a list of circuit cells to be included in the physical region; and
 generating a constraint tree, using the computer, comprising a plurality of levels each associated with a different one of the abstract constraint objects;
 generating a set of tiles using the list of abstract constraint objects, wherein each tile within the set of tiles respectively describes a geometric region of the placement area, and
 wherein generating the set of tiles comprises constructing a binary tree in which the root node represents the universe constraint, each tree node level represents a result of applying one of the list of abstract constraint objects, and each of the set of tiles is respectively represented by one of the tree leaf nodes; and
 defining at least one region in which a circuit cell is to be placed based on the set of tiles.

5. The method of claim 4 wherein said method further comprises:
 generating the at least one region in which a cell is to be placed by determining an intersection between the level's associated constraint object and at least a second region defined by a constraint object of the level's preceding level.

6. The method of claim 4 wherein said method further comprises:
 generating the at least one region in which a cell is to be placed by determining an intersection between the level's associated constraint object and a complement of at least a second region defined by a constraint object of the level's preceding level.

7. A computer program product, stored on a non-transitory computer readable medium, comprising instructions that when executed on one or more computers cause the one or more computers to perform operations implementing a tiling engine for generating a tessellated partitioning of a placement area into geometric regions based on an input set of user constraints, the operations comprising:
 receiving, from a user constraint input interface, an input set of user constraints;
 generating a list of abstract constraint objects based at least in part on the input set of user constraints, wherein the properties of each abstract constraint object include a name, a geometric region over which the constraint applies, and an object list of cells to be placed within the region;
 wherein the list of abstract constraint objects includes a universe constraint representing the hierarchical boundary of the placement area; and wherein the properties of each abstract constraint object include a name, a geometric region over which the constraint applies, and an object list of cells to be placed within the region by:
  for each user constraint of the input set of user constraints:
    classifying the input user constraint into an abstract constraint type selected from a pre-defined set of abstract constraint types;
    instantiating an abstract constraint object of the particular abstract constraint type based at least in part on the input user constraint and an enforcement policy associated with the input user constraint; and
    adding the instantiated abstract constraint object to the list of abstract constraint objects, each constraint object defining a physical region and a list of circuit cells to be included in the physical region; and
  generating a set of tiles using the list of abstract constraint objects, wherein each tile within the set of tiles respectively describes a geometric region of the placement area, and
  wherein generating the set of tiles comprises constructing a binary tree in which the root node represents the universe constraint, each tree node level represents a result of applying one of the list of abstract constraint objects, and each of the set of tiles is respectively represented by one of the tree leaf nodes.

8. The computer program product of claim 7, the operations further comprising:
  generating at least one output view of the set of tiles, wherein generating the output view comprises executing a user-configurable iterator associated with the set of tiles.

9. The computer program product of claim 7, wherein building the list of abstract constraint objects further comprises:
  ordering the list of abstract constraint objects based on at least one heuristic.

10. The computer program product of claim 9, wherein the pre-defined set of abstract constraint types includes exclusive move bounds, voltage areas, hierarchical boundaries, site rows, and JO guides.

11. The computer program product of claim 7, wherein generating the set of tiles using the list of abstract constraint objects comprises:
  instantiating the binary tree root node based on the properties of the universe constraint; and
  generating the binary tree node levels based on successively applying the abstract constraints respectively represented by each of the list of abstract constraint objects to the current leaf nodes of the tree.

12. The computer program product of claim 11, wherein applying the abstract constraints respectively represented by an abstract constraint object to the current leaf nodes of the tree comprises:
  for each current leaf node,
    creating a right child node by calculating the intersection of the abstract constraint and the current leaf node; and
    creating a left child node by calculating the subtraction of the abstract constraint and the current leaf node.

13. The computer program product of claim 12, wherein applying the abstract constraints respectively represented by an abstract constraint object to the current leaf nodes of the tree further comprises:
  pruning the right child node in an instance in which the right child node has a zero area; and
  pruning the left child node in an instance in which the left child node has a zero area.

14. The computer program product of claim 12, wherein applying the abstract constraints respectively represented by an abstract constraint object to the current leaf nodes of the tree further comprises:
  generating an error notification in an instance in which the right child node has a non-empty cell list and a zero area; and
  generating an error notification in an instance in which the left child node has a non-empty cell list and a zero area.

15. The computer program product of claim 11, wherein generating the set of tiles using the list of abstract constraint objects further comprises: storing a history of generating the binary tree node levels.

16. A system comprising:
  one or more computers and one or more storage devices storing instructions that are operable, when executed by the one or more computers, to cause the one or more computers to perform operations implementing a tiling engine for generating a tessellated partitioning of a placement area into geometric regions based on an input set of user constraints, the operations comprising:
  receiving, from a user constraint input interface, an input set of user constraints;
    generating a list of abstract constraint objects based at least in part on the input set of user constraints, wherein the properties of each abstract constraint object include a name, a geometric region over which the constraint applies, and an object list of cells to be placed within the region; wherein the list of abstract constraint objects includes a universe constraint representing the hierarchical boundary of the placement area; and
  wherein the properties of each abstract constraint object include a name, a geometric region over which the constraint applies, and an object list of cells to be placed within the region by:
    for each user constraint of the input set of user constraints:
      classifying the input user constraint into an abstract constraint type selected from a pre-defined set of abstract constraint types;
      instantiating an abstract constraint object of the particular abstract constraint type based at least in part on the input user constraint and an enforcement policy associated with the input user constraint; and
      adding the instantiated abstract constraint object to the list of abstract constraint objects, each constraint object defining a physical region and a list of circuit cells to be included in the physical region; and
    generating a set of tiles using the list of abstract constraint objects, wherein each tile within the set of tiles respectively describes a geometric region of the placement area, and wherein generating the set of tiles comprises constructing a binary tree in which the root node represents the universe constraint, each tree node level represents a result of applying one of the list of abstract constraint objects, and each of the set of tiles is respectively represented by one of the tree leaf nodes.

17. The system of claim 16, the operations further comprising: generating at least one output view of the set of tiles, wherein generating the output view comprises executing a user-configurable iterator associated with the set of tiles.

18. The system of claim 16, wherein building the list of abstract constraint objects further comprises:
ordering the list of abstract constraint objects based on at least one heuristic.

19. The system of claim 16, wherein the pre-defined set of abstract constraint types includes exclusive move bounds, voltage areas, hierarchical boundaries, site rows, and IO guides.

20. The system of claim 16, wherein generating the set of tiles using the list of abstract constraint objects comprises:
instantiating the binary tree root node based on the properties of the universe constraint; and
generating the binary tree node levels based on successively applying the abstract constraints respectively represented by each of the list of abstract constraint objects to the current leaf nodes of the tree.

21. The system of claim 20, wherein applying the abstract constraints respectively represented by an abstract constraint object to the current leaf nodes of the tree comprises:
for each current leaf node,
creating a right child node by calculating the intersection of the abstract constraint and the current leaf node; and
creating a left child node by calculating the subtraction of the abstract constraint and the current leaf node.

22. The system of claim 21, wherein applying the abstract constraints respectively represented by an abstract constraint object to the current leaf nodes of the tree further comprises:
pruning the right child node in an instance in which the right child node has a zero area; and
pruning the left child node in an instance in which the left child node has a zero area.

23. The system of claim 21, wherein applying the abstract constraints respectively represented by an abstract constraint object to the current leaf nodes of the tree further comprises:
generating an error notification in an instance in which the right child node has a non-empty cell list and a zero area; and
generating an error notification in an instance in which the left child node has a non-empty cell list and a zero area.

24. The system of claim 20, wherein generating the set of tiles using the list of abstract constraint objects further comprises:
storing a history of generating the binary tree node levels.

\* \* \* \* \*